United States Patent
Kohli

(10) Patent No.: US 8,854,901 B2
(45) Date of Patent: Oct. 7, 2014

(54) READ SELF TIMING CIRCUITRY FOR SELF-TIMED MEMORY

(75) Inventor: Nishu Kohli, Noida (IN)

(73) Assignee: STMicroelectronics International N.V., Amsterdam (NL)

(*) Notice: Subject to any disclaimer, the term of this patent is extended or adjusted under 35 U.S.C. 154(b) by 329 days.

(21) Appl. No.: 13/474,881

(22) Filed: May 18, 2012

(65) Prior Publication Data

US 2013/0308397 A1 Nov. 21, 2013

(51) Int. Cl.
*G11C 7/00* (2006.01)

(52) U.S. Cl.
USPC ............ 365/189.14; 365/49.1; 365/189.11; 365/189.15

(58) Field of Classification Search
CPC .... G11C 5/14; G11C 11/4076; G11C 7/1078; G11C 7/1084; G11C 7/109; G11C 16/12; G11C 7/22; G11C 11/418; G11C 11/419; G11C 29/50012; G11C 7/1045; G11C 8/08; G11C 8/18
USPC ............ 365/154, 156, 148, 171, 173, 163, 365/189.06, 189.07, 189.08, 189.09, 365/189.11, 189.05, 189.03, 189.15, 365/189.14, 189.16, 49.1, 49.12, 49.15
See application file for complete search history.

(56) References Cited

U.S. PATENT DOCUMENTS

| | | | |
|---|---|---|---|
| 5,581,500 A | 12/1996 | D'Souza | |
| 6,519,204 B2 | 2/2003 | Slamowitz et al. | |
| 6,556,487 B1 | 4/2003 | Ratnakumar et al. | |
| 8,345,469 B2 | 1/2013 | Pelley et al. | |
| 2002/0149974 A1* | 10/2002 | Sato et al. | 365/189.11 |
| 2007/0279966 A1 | 12/2007 | Houston | |
| 2008/0137440 A1* | 6/2008 | Liaw | 365/189.04 |
| 2012/0307574 A1* | 12/2012 | Cheng et al. | 365/189.14 |
| 2013/0308397 A1 | 11/2013 | Kohli | |

* cited by examiner

*Primary Examiner* — Hien Nguyen
(74) *Attorney, Agent, or Firm* — Gardere Wynne Sewell LLP

(57) ABSTRACT

A self-timed memory includes a plurality of timer cells each including an access transistor coupled to a true node and having a gate coupled to a reference wordline actuated by a reference wordline driver. Self-timing is effectuated by detecting completion of reference true bitline discharge in the timer cells resulting in enabling a sense amplifier. To better align detected completion of the discharge by the timer cells to a read from actual memory cells at any voltage in the operating voltage range of the memory, the gate to source voltage of the timer cells' access transistors is lowered by decreasing the logic high voltage level applied by the reference wordline. The timer cells may also, or alternatively, have pulldown transistors coupled to the internal true node, wherein a gate terminal of the pulldown is coupled to the reference wordline node and activated with the lowered gate to source voltage.

25 Claims, 8 Drawing Sheets

US 8,854,901 B2

READ SELF TIMING CIRCUITRY FOR SELF-TIMED MEMORY

TECHNICAL FIELD

The present invention relates to integrated self-timed memory circuits and in particular to a self-timed static random access memory (SRAM) integrated circuit.

BACKGROUND

Reference is made to FIG. 1 which shows a schematic diagram of a standard six transistor (6T) static random access memory (SRAM) cell 10. The cell 10 includes two cross-coupled CMOS inverters 12 and 14, each inverter including a series connected p-channel and n-channel transistor pair. The inputs and outputs of the inverters 12 and 14 are coupled to form a latch circuit having a true node 16 and a complement node 18. The cell 10 further includes two transfer (pass gate) transistors 20 and 22 whose gate terminals are coupled with a wordline node and are controlled by the signal present at the wordline node (WL). Transistor 20 is source-drain connected between the true node 16 and a node associated with a true bitline (BLT). Transistor 22 is source-drain connected between the complement node 18 and a node associated with a complement bitline (BLC). The source terminals of the p-channel transistors in each inverter 12 and 14 are coupled to receive a high supply voltage (for example, VDD) at a high voltage node $V_H$, while the source terminals of the n-channel transistors in each inverter 12 and 14 are coupled to receive a low supply voltage (for example, GND) at a low voltage node $V_L$. The high voltage VDD at the node $V_H$ and the low voltage GND at the node $V_L$ comprise the power supply set of voltages for the cell 10.

In an integrated circuit including the SRAM cell 10, this power supply set of voltages may be received at pins of the integrated circuit, or may instead be generated on chip by a voltage regulator circuit which receives some other set of voltages received from the pins of the chip. The power supply set of voltages at the nodes $V_H$ and $V_L$ are conventionally applied to the SRAM cell 10 at all times that the cell/integrated circuit is operational. It will be recognized that separate low voltage values at node $V_L$ may be provided for the sources of the n-channel MOS transistors in the inverters 12 and 14 while separate high voltage values at node $V_H$ may be provided for the sources of the p-channel MOS transistors in the inverters 12 and 14.

The reference above to a six transistor SRAM cell 10 of FIG. 1 for use as the data storage element is made by way of example only, it being understood to those skilled in the art that the cell 10 could alternatively comprise a different data storage element. The use of the term SRAM cell 10 will accordingly be understood to refer any suitable memory cell or data storage element, with the circuitry, functionality and operations presented herein in the exemplary context of a six transistor SRAM cell.

Reference is now made to FIG. 2 which shows a block diagram of a self-timed memory 30, for example of the static random access memory (SRAM) type using SRAM cells 10, with "w" words and "b" bits organized as a column mux of "m". Those skilled in the art understand that self-timed memories need to support a high dynamic operating voltage range. In other words, these memories need to be functional over a wide range of supply voltages, starting from a very high operating voltage and down to a very low operating voltage. In most cases, in the low operating voltage range, it is considered acceptable if the memory achieves a lower performance (i.e., it is slower). In nominal operating voltage range, the memory needs to support a higher performance (i.e., it needs to be faster).

The memory 30 includes a first section 32 comprising a plurality of memory (such as SRAM) cells 10 arranged in a matrix format and which function to store data. The first section 32 includes "b" sub-sections 34 corresponding to the "b" bits per word stored by the memory. The first section 32 is arranged to store "w" words and is organized as a column mux of "m". Thus, each of the "b" sub-sections 34 is organized in "w/m" rows with "m" columns in each row. In the first section 32, all cells 10 in a same row share a common wordline (WL) coupled to an output of a row decoder circuit 60 (well known to those skilled in the art), and all cells 10 in a same column share a common true bitline (BLT) and a common complement bitline (BLC) coupled to column circuitry 62 (which includes bitline precharge and equalization circuitry, column mux circuitry, write driver circuitry, column address decoder circuitry and input/output circuitry, each of which is well known to those skilled in the art).

To read data from the first section 32, the wordline of the row selected according to the row address is driven high by the row decoder circuitry 60, a column is selected in each sub-section 34 by the column address decoder and column mux in the column circuitry 62 based on the column address to connect the selected column's true bitline and complement bitline to the input/output circuitry (which, for example, will typically utilize sense amplifiers), and both the true bitline and complement bitline of the selected column in each sub-section 34 are made floating by the precharge and equalization logic in the column circuitry 62. One of the true bitline and complement bitline discharges in each sub-section 34 depending on whether the internal true node 16 or complement node 18 of the memory cell 10 in the selected row and column in the sub-section 34 stores a logic zero. This discharge is sensed by the sense amplifiers corresponding to respective sub-section 34 in the input/output logic of the column circuitry 62 to transfer the stored data state to the respective memory output pin.

The memory 30 includes a second section 46 including plurality of memory cells 10 arranged in a matrix format, but these cells do not function to store data. Indeed, these cells are only required, if desired, in order to have a regular layout of the memory array. The wordline ports of the memory cells 10 both the rows in this section are connected to the ground reference voltage (GND).

The memory 30 includes a third section 36 including plurality of memory cells 10 arranged in a matrix format, and these cells also do not function to store data. Rather, these cells in the third section 36 are used to emulate the same load on a reference wordline (REFWL), which is coupled to a reference row decoder 64 within the section 36, as is present on the actual wordlines (WL) of the first section 32. In other words, the purpose of section 36 is to emulate a total load of "b*m" columns of memory cells 10 on the reference wordline REFWL. It will be noted that the REFWL signal generated by the reference row decoder circuit 64 passes through the second section 46 to the third section 36 without being connected to cells 10 included in section 46.

The section 36 includes "b" sub-sections 38. Each sub-section 38 includes two rows of "m" memory cells 10. All memory cells 10 within the third section 36 either have their true bitlines and complement bitlines connected to a power supply voltage (for example, at node $V_H$) or have them floating. The wordline ports of the memory cells 10 within one of the two rows of the first half of the total "b" sub-sections 38 (i.e., of the first "b/2" sub-sections 38) are coupled to the reference wordline signal generated by the reference row decoder circuit 64 and arriving in section 36 after having passed through the second section 46. This is done to emulate the same propagation delay corresponding to "b*m/2" columns on REFWL as is present on all the WL signals in propagating from row decoder 60 to the middle of section 32. Further, the REFWL signal which has thus reached at or about the center of the section 36 is twisted back and returned towards reference row decoder circuit 64. This returning REFWL signal is connected to the other of the two rows of the first half of the total "b" sub-sections 38 (i.e., of the first "b/2" sub-sections 38), eventually reaching the second section 46 again after experiencing a propagation delay corresponding to travelling across "b*m" columns—same as that experienced by the signal WL in propagating from row decoder 60 to the column farthest from the row decoder 60 at the end of section 32. The reference wordline of the memory cells 10 in both rows within other "b/2" sub-sections 38 (i.e., later "b/2" sub-sections 38) is coupled to a ground supply voltage (at the node $V_L$) because these sub-sections 38 are present in the memory only for maintaining regularity and rectangular shape of the array of the memory cells 10, and so the memory cells 10 in these sub-sections 38 are deactivated permanently by connecting their wordline ports to a ground supply voltage (for example, at the node $V_L$).

The memory 30 further includes a fourth section 40 including a plurality of read timer cells 42 and load cells 44 arranged in a matrix format: "w/m" rows and one column. The timer cells 42 and load cells 44 each have a configuration similar to a memory cell 10, but with different connections as shown, in an exemplary manner, in FIGS. 3A-3C for timer cells 42 and FIGS. 3D-3E for load cells 44.

The timer cells 42 are essentially pre programmed memory (for example, SRAM) cell like elements that are built from the same devices as used by the memory cells 10 in section 32. These timer cells 42 operate to discharge the reference true bitline (REFBLT) in response to arrival of a reference wordline (REFWL) signal (with their discharge time being indicative of time required to discharge of actual bitline until safe detection level during a read operation). It may also be noted that the timer cell configurations in FIGS. 3A and 3B discharge both reference true bitline (REFBLT) and reference complement bitline (REFBLC), and are helpful in using double the number of discharge cells with double the load on the reference bitline for improved statistical variability without any area impact. However, going further, for the purpose of description of functionality only, a description is provided for the use of discharge of only the reference true bitline (REFBLT) at the next logic stage, without any loss in the description of functionality.

The load cells 44 are elements similar to timer cells 42, with the difference that either their reference wordline (REFWL) ports only or both the reference wordline (REFWL) ports and the gate terminal of the pulldown transistor in series with the passgate transistor coupled with reference true bitline (REFBLT) are grounded, so that they do not discharge REFBLT and REFBLC and only serve to match the load of actual bitlines (BLT/BLC) on REFBLT and REFBLC. The wordlines WL generated in the row decoder circuitry 60 simply pass through this section 40 in order to reach the first section 32.

With respect to the timer cells 42, the reference true bitlines (REFBLT) and reference complement bitlines (REFBLC) are shared with each other, respectively, along a column and the reference wordlines (REFWL) for the timer cells 42 are shared with each other and coupled to the reference wordline (REFWL) node at the point emerging from the second section 46 after having traversed through and returned after half the columns in the memory in third section 36. With respect to the load cells 44, the reference wordline (REFWL) ports are grounded as already described earlier. Furthermore, with respect to the timer cells 42 and load cells 44, the reference true bitlines (REFBLT) and reference complement bitlines (REFBLC) are shared with each other, respectively, along a column and connected to the column circuitry 62.

There are a total of "w/m" timer cells 42 and load cells 44, in order to emulate same load on the reference true and complement bitlines within section 40 as is present on the true and complement bitlines within first section 32. A certain number of these "w/m" cells are timer cells 42, and the remaining are load cells 44. Multiple timer cells 42 are used in order to discharge the reference true bitline (REFBLT) at a much faster rate as compared to the rate at which the selected actual memory cells 10 discharge the actual bitlines (BLT or BLC depending on data stored in the respective memory cells 10) during a read operation. The rate of discharge for reference true bitline (REFBLT) is desired to be much faster than the rate of discharge of the actual bitline (true or complement) so that the node REFBLT is able to discharge to a level detectable by an inverter circuit contained within the column circuitry 62 (for example, almost VDD/2) in the same time in which a statistically worst memory cell 10 is able to discharge the actual bitline (BLT or BLC) to a voltage level beyond the offset of the sense amplifiers (contained in column circuitry 62). Also, the multiple timer cells 42 help in reducing statistical variability of the access and cycle time of read operation. This detection of REFBLT discharge is propagated by subsequent logic to generate an enable signal which activates the sense amplifiers (also contained in the column circuitry 62) during a read operation. Thus, the intention of this operation is to time the activation of the sense amplifier at an optimum time permitting a certain statistically worst memory cell 10 in section 32 to clear the sense amplifier offset for reading from that memory cell 10.

A more detailed description of memory operation is now provided. Before any read cycle begins, all memory bitlines and the reference bitlines are precharged to logic high (VDD), and all memory wordlines (WL) and the reference wordline (REFWL) are driven to logic low (GND). At the start of a valid read operation characterized by the "clock" edge when the "chip select" signal is asserted for enabling the memory and the "write enable" signal is asserted to the level corresponding to the read operation, a clock generator triggers the internal clock signal at the arrival of the "clock" edge (either rising or falling edge depending on the functionality of the memory). The internal clock signal causes the following operations to be performed more or less concurrently: a) driving of one of the "w/m" wordlines (WL), selected depending on row address, to logic high (VDD); b) driving of the reference wordline (REFWL) to logic high (VDD); c) turning off of precharge of the reference bitlines (REFBLT, REFBLC) and of the bitlines (BLT, BLC) of one of the "m" columns of each of "b" bits, selected depending on column address; d) connecting one of the "m" true bitline (BLT) and complement bitline (BLC) pairs in each of the "b" bits to the inputs of the sense amplifier circuitry (contained within the column circuitry 62).

The triggering of above operations in turn starts the following operations (performed more or less concurrently): a) the rising of the selected wordline starts an operation in each selected memory cell 10 (in the first section 32) to discharge either the true bitline (BLT) or complement bitline (BLC) based on the stored data; and b) the rising of reference wordline (REFWL) starts an operation in the timer cells and load cells of third section 40 to discharge the reference true bitline (REFBLT).

It will be noted that in each bit (I/O), there is only a single memory cell 10 which causes a discharge of one of the true and complement bitlines (BLT, BLC), but there are multiple timer cells 42 in a column causing a discharge of the reference true bitline (REFBLT). Thus, over a same time period in which one of the true and complement bitlines (BLT, BLC) in any bit (I/O) discharges by a first voltage amount (e.g., x mV), the reference true bitline (REFBLT) would be expected to discharge by a second voltage (e.g., y mV), where y>x, because the number of timer cells 42 discharging the reference true bitline (REFBLT) is greater than the single actual memory cell 10 discharging the bitlines (BLT or BLC) in any bit (I/O). It can also be observed that the time it takes for bitline discharge (i.e., data to be read from any memory cell 10 of the first section 32) is much more variable than what it takes for true reference bitline (REFBLT) discharge from the timer cells 42 of the fourth section 40 because of the presence of multiple timer cells (the standard deviation of the read current of "n" memory cells is known to be "sigma/squareroot (n)" where "sigma" is the standard deviation of a single memory cell 10).

In the memory of FIG. 2, as per the prior art, both the wordline WL and reference wordline REFWL are driven by similarly sized drivers, to a full logic high (VDD), causing the discharge of one of the bitlines (either BLT or BLC depending on data present in the selected memory cell 10 in any bit (I/O)) as well as the true reference bitline REFBLT. The discharge of reference bitline further generates the sense amplifier enable signal. The generated sense amplifier enable signal activates the sense amplifier for each bit (I/O) so as to allow the sense amplifier circuitry to resolve the discharge of one of the true or complement bitlines (BLT, BLC) of the selected column in that bit (I/O) to a logic low (GND) or logic high (VDD). The data resolved by the sense amplifiers of different bits (I/Os) is transferred to memory output ("Q") of respective bits, thus completing the read operation.

It is desirable to have the timer cells 42 designed and their number chosen such that, in about the same time that a statistically worst memory cell 10 takes to discharge one of the true and complement bitlines (BLT, BLC) beyond the sense amplifier offset voltage, on a certain worst process (P), voltage (V) and temperature (T) condition, the multiple timer cells 42 are able to discharge the true reference bitline REF-BLT to a level detectable by a simple detector circuit such as an inverter within the column circuitry 62. That way, the discharge of true reference bitline REFBLT can be detected by the column circuitry 62 to generate the sense amplifier enable signal at an optimum time for performing the read operation successfully and with a least read access and cycle time.

Reference is now made to FIG. 4 which presents a timing diagram illustrating the read operation. From FIG. 4, it can be observed that in order to design a robust memory (i.e., one capable of successful read/write operations in spite of high statistical variability in electrical characteristics of the memory cell 10), it is important to tune the delay duration "TREFBLT" (measuring the delay from initiation of the discharge of the true or complement bitline (BLT, BLC) of any bit (I/O) to a full voltage swing discharge of the true reference bitline REFBLT) in such a way that a read from a statistically worst memory cell 10 is able to provide sufficient voltage differential (partial voltage swing) between the true and complement bitlines (BLT, BLC) to clear the sense amplifier voltage offset for correct operation of sense amplifier resulting in sensing of the appropriate read data. Thus, if "iread" is the read current of a statistically worst memory cell 10, and "irefread" is the current of the "n" timer cells 42, the ideal scenario is to have the ratio "irefread/iread" substantially constant across the process, voltage and temperature conditions of the memory. The ratio should be such that for any process, voltage and temperature condition, the time it takes for one of the true and complement bitlines (BLT, BLC) to discharge beyond the sense amplifier offset is equal to the time it takes for the true reference bitline REFBLT to discharge almost fully and be detected by a simple detector circuit such as an inverter which is used to generate the sense amplifier enable (SAEN) signal.

The issue with the prior art design described above is that the read current (i.e., iread) for a statistically worst memory cell 10 in section 32 is produced by the pass-gate and pull-down transistor devices (see, FIG. 1 and the n-channel passgates 20 and 22 and the n-channel pulldowns within latches 12 and 14) whose threshold voltages ("vtpg" and "vtpd", respectively) are much higher than those of any nominal memory cell 10 (i.e., memory cell with average read current) within section 32. However, the current which discharges the true reference bitline REFBLT is produced by multiple timer cells 42. Those multiple timer cells 42 coupled together in parallel in section 40, while reducing the statistical variability and hence resulting in discharge current of the timer cell which more nearly matches that of the passgate and pulldown devices for memory cells 10 in section 32 having nearly nominal threshold voltages with multiplicity of number of number of timer cells, is not representative of the statistically worst memory cell 10 (in terms of voltage characteristics). This condition may lead to non-optimal voltage scaling characteristics of sense amplifier enable time and hence also of memory read access time.

The reason for the difference in voltage characteristics mentioned above is that the current of a mosfet as a function of operating voltage is such that the change in current is much greater with change in voltage when the operating voltage of the memory is nearer to the transistor threshold voltage, as compared to when operating voltage of the memory is much higher than the transistor threshold voltage. Thus, those skilled in the art will recognize that as per the design described above, if "n1" timer cells 42 are required for qualifying the statistically worst memory cell 10 read current at a certain low operating voltage (i.e., to achieve a desired irefread/iread ratio), then at a higher operating voltage, because of the discharge current of timer cells 42 increasing by lesser percentage compared to the discharge current of statistically worst memory cell 10, the same "n1" timer cells would lead to a lower "irefread/iread" ratio (i.e., a successful but slower operation leading to sub-optimal access time of read operation). This means that as per design approach described above (primary design parameter is the electrical characteristics of read timer cell 42 and its number), if a memory read self timing is designed to be functional at a certain low voltage using a certain number of timer cells (say "n1"), that same number "n1" timer cells will lead to a much slower operation and hence higher read access and cycle time what is possible to achieve when the memory is operated at a higher voltage. In other words, the performance (read access time and cycle time) will be sub-optimal at higher operating voltages. The amount of extra margin that is undesirably introduced at those higher operating voltages increases as the designed-to minimum operating voltage is lowered.

To address this issue, one prior art circuit uses two different numbers of timer cells 42 (say "n1" and "n2"), to be selectively chosen based on operating voltage of the memory. For example, "n1" timer cells 42 would be used over one range of operating voltage and "n2" timer cells 42 would be used over another range of operating voltages. To assist the operation for selecting a number of timer cells 42 for use, the memory device would include a low voltage control signal input (for example, LV) for selecting the number of timer cells 42. If the control signal input is in a first logic state, then n1 timer cells 42 are enabled for use in discharging the true reference bitline REFBLT, while if the control signal input is in a second logic state, then n2 timer cells 42 are enabled for use in discharging the true reference bitline REFBLT.

Limitations of this prior art solution include: a more complicated system design resulting from having to generate and process the low voltage control signal input (LV) based on operating voltage; and voltage scaling of memory read access and cycle time that are not seamless across the entire operating voltage range because there will be an abrupt change in read performance when the operating voltage changes across the threshold point for low voltage control signal (LV) and the low voltage control signal transitions in response thereto.

More generally speaking, the prior art solutions consider two options.

In a first option, the designer may decide the number of timer cells 42, capacitance on the reference bitline and logic delay subsequent to reference bitline when the reference wordline REFWL level is full logic high level "VDD", based on the required "wordline on to sense amplifier enable" time for a statistically worst memory cell 10 to generate a voltage differential greater than sense amplifier offset at the inputs of the sense amplifier, at the minimum required memory functional voltage at the worst case temperature and for the worst case process corner, and operate with the same setting on other voltages.

In a second option, the designer may decide the number of timer cells 42, capacitance on the reference bitline and logic delay subsequent to reference bitline at multiple voltage points (typically two) when the reference wordline REFWL=VDD, after sub-dividing the required memory functional voltage range into smaller voltage ranges (typically two), tune the parameters to obtain required "wordline on to sense amplifier enable" time at the lower voltage limit of each range, and then control the selection of respective setting with control pins required to be asserted/deasserted corresponding to the voltage range of operation at any point of time.

Both of the above solutions have shortcomings as described earlier. A need therefore exists in the art to address the foregoing problems with respect to self-timed memory read operation over a wide range of supply voltage. Such a memory will have optimum read access and cycle time at all voltages in the supported voltage range including the nominal (higher) voltage range. Thus, such a memory will have a very low read access and cycle time value in nominal (higher) voltage range required during high frequency operations while still remaining functional for read in a lower operating voltage, without any control signal requirements from the system.

SUMMARY

In an embodiment, a circuit comprises: a memory cell array and a reference row decoder circuit. The memory cell array includes: a first section having a plurality of memory cells and a wordline for each row of memory cells in said first section; and a second section having a plurality of timer cells arranged in a column, each timer cell including a reference wordline, a reference true bitline, an internal true node, an access transistor coupled between said internal true node and said reference true bitline and a pull-down transistor coupled between said internal true node and a reference supply node, wherein the reference true bitline is shared by the column of read timer cells. The reference row decoder circuit is coupled to the second section of the memory cell array, and includes a reference wordline driver circuit having an output coupled to drive the reference wordline. The circuit further includes means for lowering a gate to source voltage of a timer cell transistor by decreasing a higher voltage level corresponding to logic high that is applied on said reference wordline to actuate at least one of said access transistor and pull-down transistor during a read operation of memory cells in the first section.

In an embodiment, self-timing circuitry is provided for use in a memory, wherein the memory includes a plurality of memory cells. The self-timing circuit comprises: a plurality of timer cells arranged in a column; a reference true bitline coupled to the column of read timer cells; a reference wordline for each timer cell in the column; wherein each timer cell includes an internal true node, an access transistor coupled between said internal true node and said reference true bitline and a pull-down transistor coupled between said internal true node and a reference supply node; a reference wordline driver circuit having an output coupled to said reference wordline; a detection circuit coupled to said reference true bitline and having an output whose logic state changes in response to completion of discharge of the reference true bitline during a read operation; and a circuit configured to lower a gate to source voltage of timer cell transistors by decreasing a higher voltage level corresponding to logic high that is applied on said reference wordline to actuate at least one of said access transistor and pull-down transistor during a read operation of memory cells in the memory.

In an embodiment, a method comprises: reading a logic value from a true side of a timer cell of a self-timed memory, said timer cell including an access transistor coupled between an internal true node and a reference true bitline and a pull-down transistor coupled between said internal true node and a reference supply node; detecting a completion of the logic value read at the reference true bitline of the read timer cell of the self-timed memory; signaling an enabling of a sense amplifier operation of the self-timed memory in response to detected logic value read completion; and lowering a gate to source voltage of a timer cell transistor by decreasing a higher voltage level corresponding to logic high that is applied on said reference wordline to actuate at least one of said access transistor and pull-down transistor during said logic value read.

BRIEF DESCRIPTION OF THE DRAWINGS

For a better understanding of the embodiments, reference will now be made by way of example only to the accompanying figures in which.

DETAILED DESCRIPTION OF THE DRAWINGS

Figure 4:
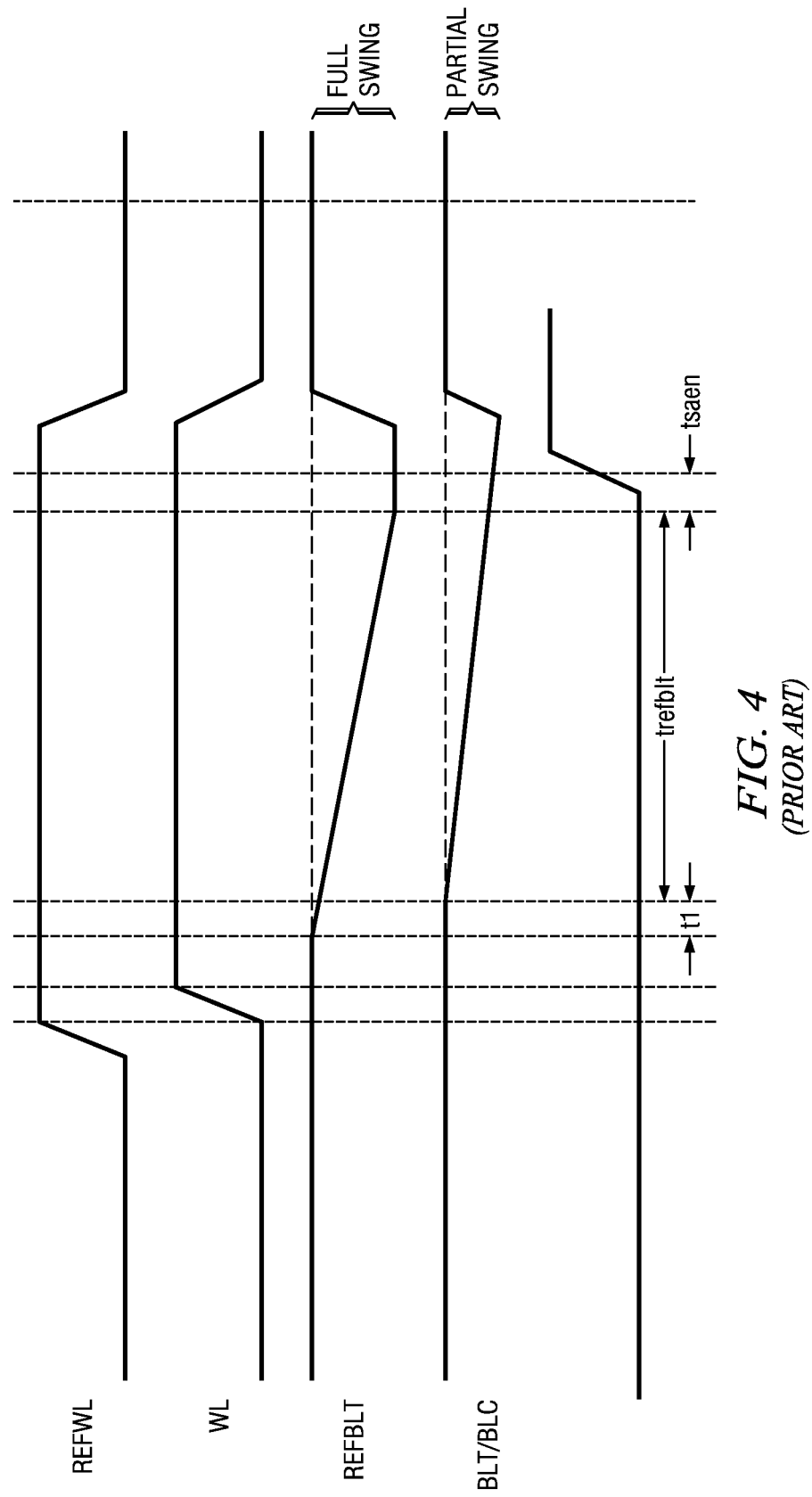
FIG. 4 shows a timing diagram concerning operation of the memory of FIG. 2.

Reference is once again made to FIG. 4. The ideal scenario for most optimal performance across the entire range of operating voltage is to have the ratio "irefread/iread" be more or less constant across the voltage range, where "irefread" is "n*(nominal memory cell 10 read current)", where n is the number of timer cells 42, and "iread" is the read current corresponding to statistically worst memory cell 10. Since the problem is that "iread" degrades much faster with voltage, as compared to "irefread" (owing to higher threshold voltage of passgate and pulldown transistors in the actual statistically worst memory cell 10 compared to multiple timer cells 42), the tracking of the ratio "irefread/iread" will be better if the overdrive factor "vgs-vt" of the pass-gate and/or pulldown device of timer cells 42 are reduced by a similar amount as the expected increase in threshold voltages "vt" of passgate and pulldown devices of memory cell 10 which provides a statistically worst read current "iread".

Unfortunately, it is complicated and impractical to control the threshold voltage "vt" of the transistors in the timer cells 42 through the fabrication process. In any event, the timer cells 42 nonetheless tend to provide a discharge current corresponding to nominal threshold voltage "vt" owing to presence of multiple timer cells. A possible way to emulate the shift in threshold voltage "vt" of the devices in the memory cell 10 with a statistically worst read current (for which the design is to be qualified) is to instead reduce the gate to source voltage "vgs" of passgate and/or pulldown devices in the timer cells 42 by an amount equal to the amount of the expected shift in threshold voltage "vt" of the devices of the memory cell with the statistically worst read current. This will lead to a same overdrive factor "vgs-vt" upon which a transistor current is dependent on the devices in the timer cells 42 as is present on the devices in the memory cell 10 producing the statistically worst read current. Thus, this will allow for maintenance of a nearly constant ratio "irefread/iread" across a wide operating voltage range.

Two options are presented for solving the issues described above.

In a first option, a circuit is introduced to generate a voltage lowered by "delta" amount from logic high level "VDD", where "delta" is the expected shift in threshold voltage "vt" of the passgate device only, or of both passgate and pulldown devices, for the memory cell 10 with the statistically worst read current to be qualified, and then use this new supply voltage lowered from "VDD" as the supply voltage on the final stage of the reference wordline driver. Additionally, the number of timer cells and other parameters are chosen to meet the required "wordline on to sense amplifier enable" time at the lowest voltage in the full operating voltage range at a worst case temperature and for a worst case process corner (wherein the new number of timer cells is expected to be higher than those in previously discussed state of the prior art).

In a second option, a circuit is introduced at the output of the reference wordline driver to restrict the rising of the reference wordline during actuation to a voltage of "VDD-delta" instead of "VDD", where "delta" is the expected shift in the threshold voltage "vt" of the passgate device only or both passgate and pulldown devices of the memory cell 10 with the statistically worst read current to be qualified. Additionally, the number of timer cells and other parameters are chosen to obtain the required "wordline on to sense amplifier" enable time at a worst case temperature and for a worst case process corner.

The gate to source voltage "vgs" of the passgate device only, or both pass-gate and pulldown devices, of the timer cells 42 is decided by the voltage level of the reference wordline REFWL. So, in order to achieve a lower gate to source voltage "vgs" on the passgate device only, or both passgate and pulldown devices, of the timer cells 42, embodiments herein propose use of a circuit which provides a mechanism to reduce the voltage level of the reference wordline during activation from logic high level "VDD" to "VDD-delta" with "delta" being constant and independent of "VDD" and decided based on an estimation of an increase in threshold voltage "vt" of the passgate device only, or both passgate and pulldown devices, of the memory cell 10 with the statistically worst read current to be qualified. This reduction in reference wordline REFWL voltage level is applicable regardless of whether the timer cell 42 is configured such that the gate to source voltage "vgs" lowering is applied only on the passgate devices or is instead applied on both the passgate and pulldown devices: although the value of the lowering ("delta") may be dependent on whether this lowering is applied on passgate devices of the timer cells 42 only or both the passgate and pulldown devices of the timer cells 42. The better the control exercised over the reference wordline voltage lowering ("delta") with respect to voltage, process, and temperature change, the more optimal the performance of the memory during self-timed read operation across the entire operating voltage range.

Figure 1:
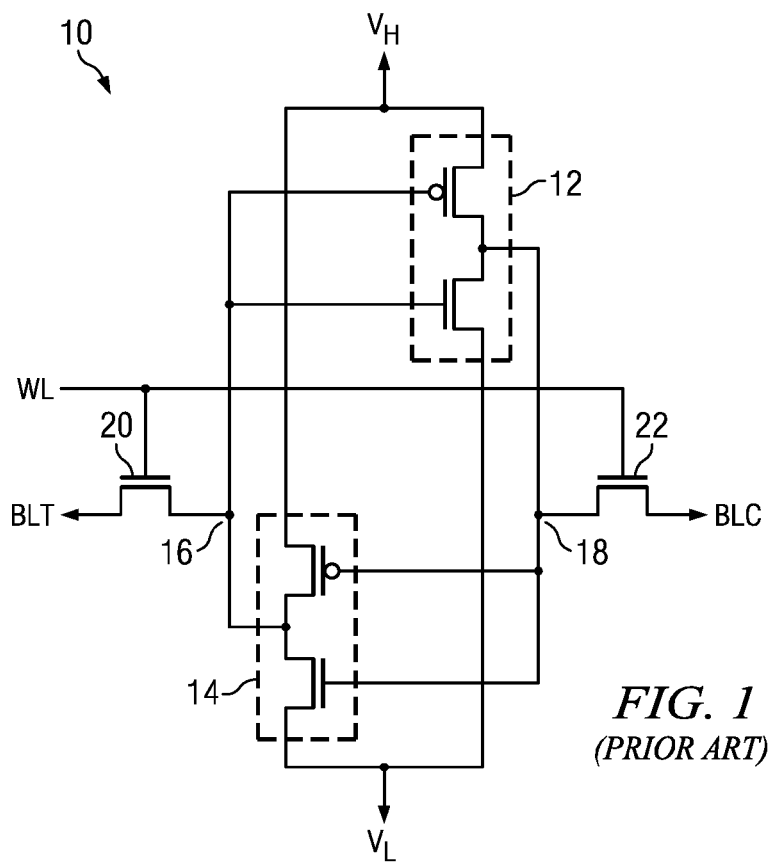
FIG. 1 is a schematic diagram of a standard six transistor static random access memory (SRAM) cell.
Figure 3A:
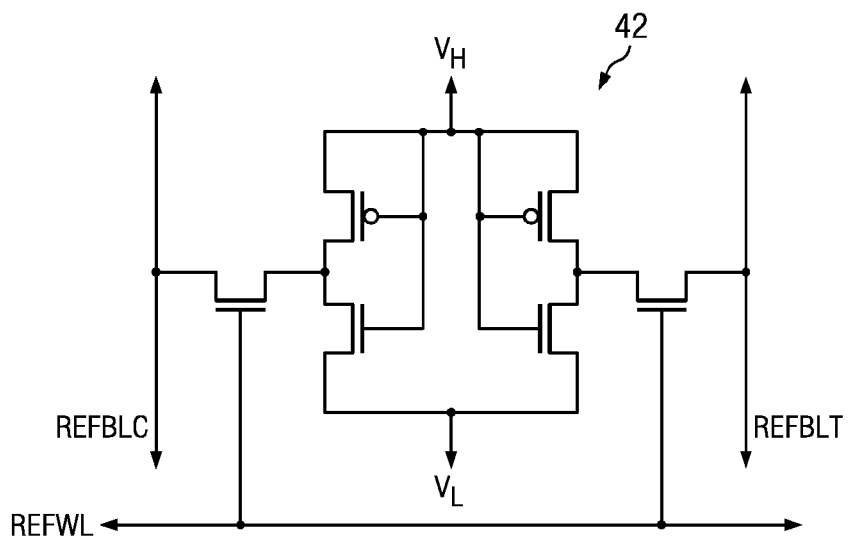
FIGS. 3A-3C show schematic diagrams of read timer cells.
Figure 2:
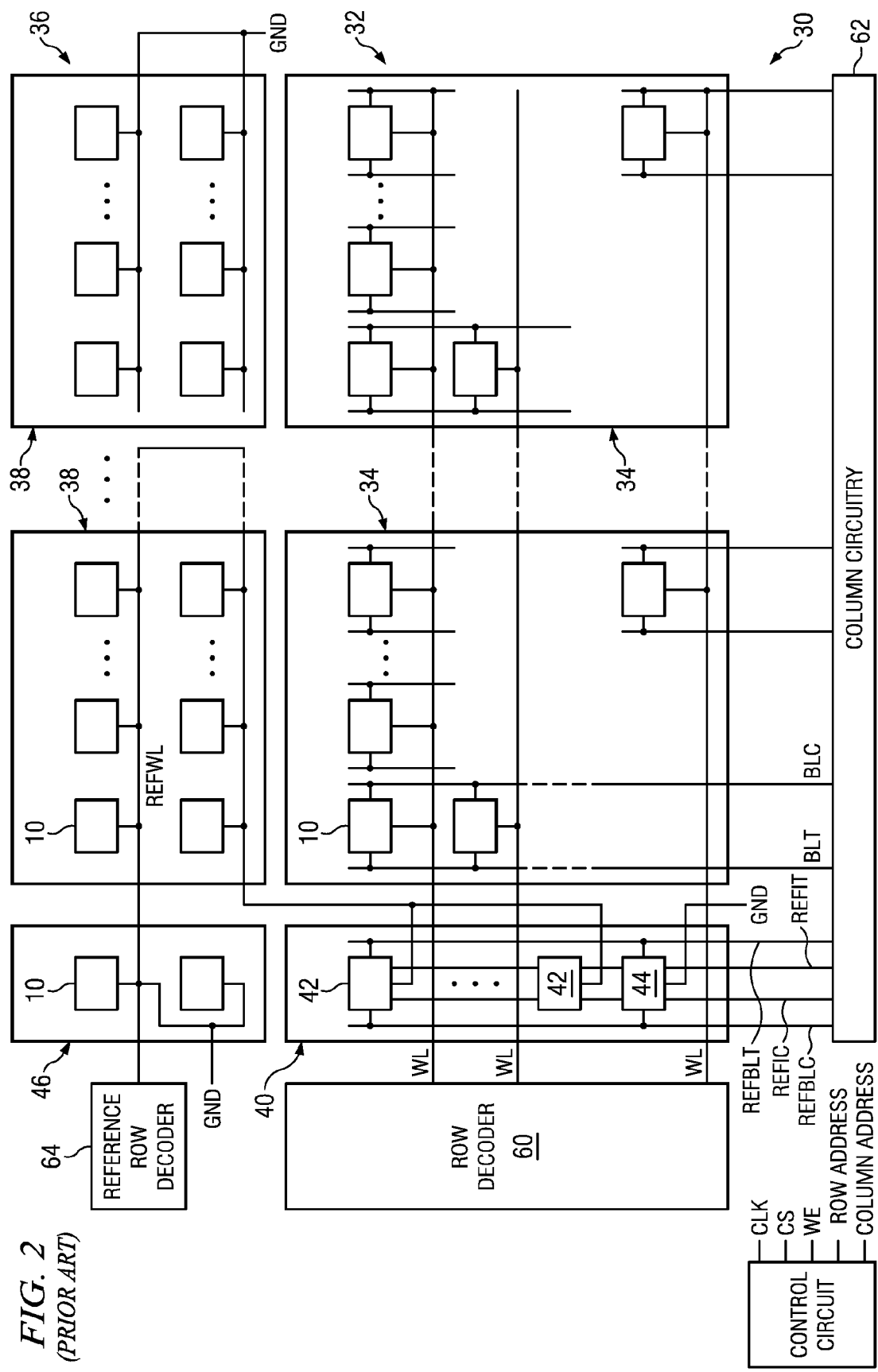
FIG. 2 shows a block diagram of a self-timed memory.
Figure 3B:
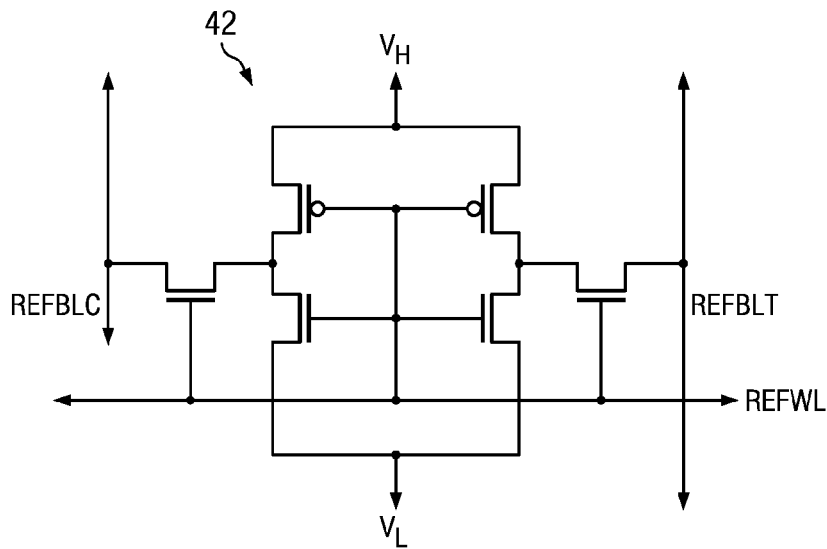
Figure 3C:
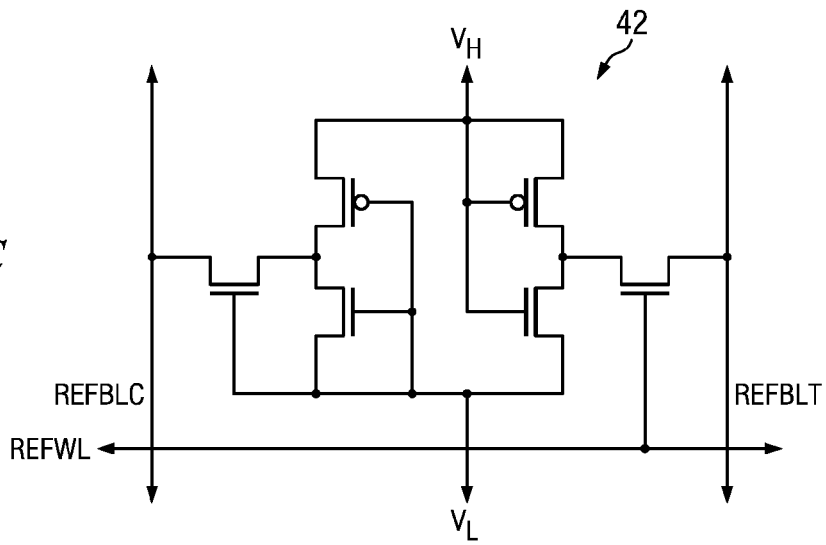
Figure 3D:
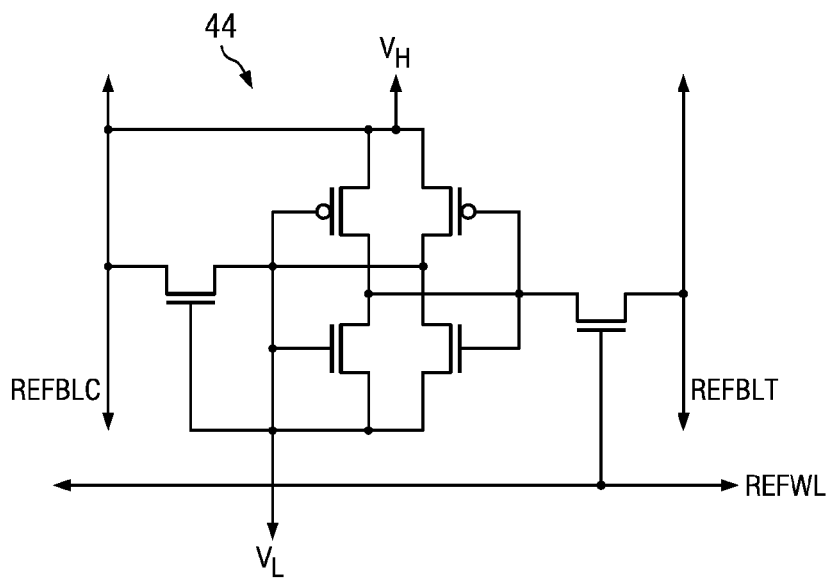
FIGS. 3D-3E show schematic diagrams of load cells.
Figure 3E:
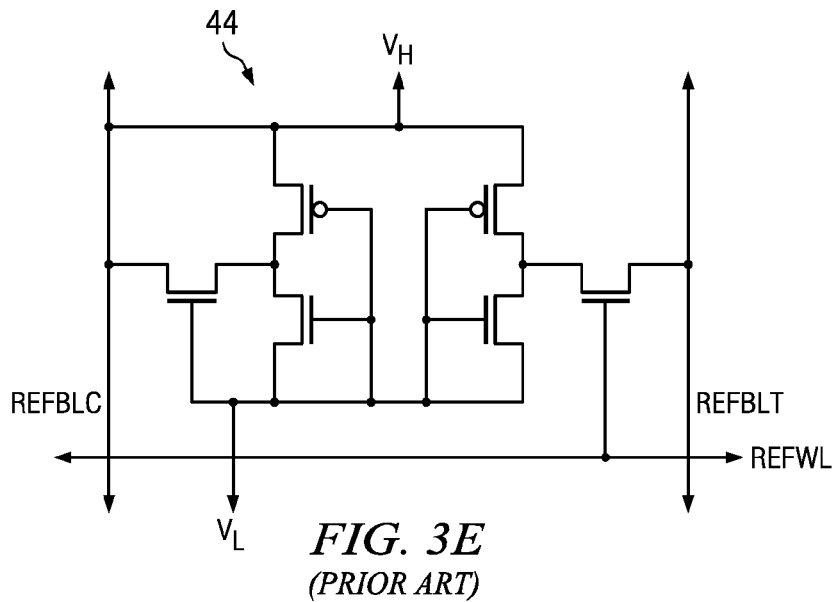
Figure 5A:
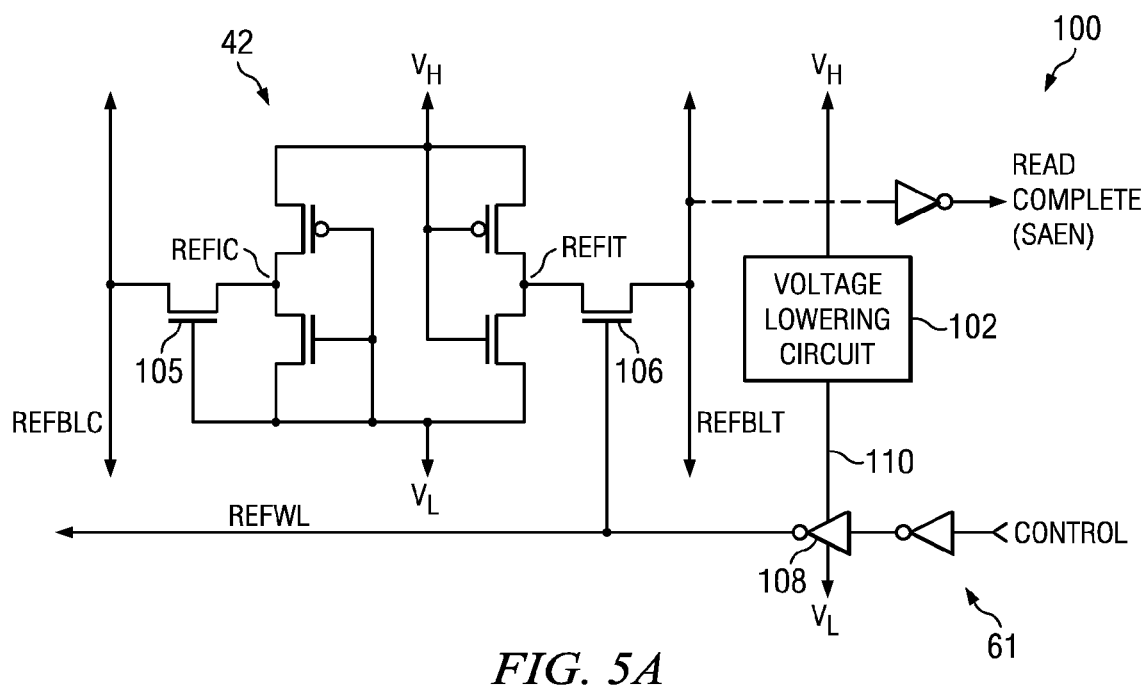
FIGS. 5A and 5B illustrate a circuit diagram of a read timer cell and reference wordline driver circuit.

Reference is now made to FIG. 5A which illustrates a circuit diagram of a timer cell 42 and a reference wordline REFWL driver circuit 100 which is included within the reference row decoder 64 circuitry of the memory 30. Here, the timer cell 42 is configured with only the passgate transistor 106 for the internal true node REFIT having a control (gate) terminal coupled to the reference wordline REFWL. The passgate 105 on the internal complement node REFIC of the cell 42 has a control (gate) terminal coupled to the ground voltage supply at node $V_L$ (GND). The timer 42 is of the type shown in FIG. 3C, although it will be understood that other timer cell 42 circuit configurations could be used.

In prior art reference wordline driver circuits, a buffer (perhaps comprising multiple inverting stages) would have power supply nodes connected to the positive voltage supply (VDD) and the ground voltage supply (GND). Thus, a final inverting driver of the reference wordline driver would produce an output signal, responsive to an input internal clock signal on "CONTROL", with a voltage swing from ground (GND) to full supply voltage (VDD). This output signal would be applied to the reference wordline REFWL of each included (and parallel connected) timer cell 42.

In FIG. 5A, however, a buffer 61 of circuit 100 includes a final inverting driver 108 having power supply nodes that are connected to the ground voltage supply at node $V_L$ (GND) and to an intermediate voltage at node 110 receiving a voltage that is lowered below the positive voltage supply at node $V_H$ (VDD) by a "delta" voltage value. To accomplish this, a voltage lowering circuit 102 is introduced between the higher power supply node (node 110) of the final inverting driver 108 and the positive voltage supply at node $V_H$ (VDD). As a result, the final inverting driver 108 produces an output signal, responsive to an input clock signal on "CONTROL", with a voltage swing from the lowered intermediate voltage "VDD-delta" to ground voltage (GND). When the lowered voltage "VDD-delta" is applied to the control (gate) terminal of the pass gate transistor 106 coupled to the internal true node REFIT for timer cell 42, that intermediate voltage ("VDD-delta") lowers the gate to source voltage "vgs" of the passgate transistor 106 from VDD. The "delta" value introduced by the voltage lowering circuit 102 is selected to be an estimate of an expected shift in the threshold voltage "vt" of the passgate device 106 of the memory cell 10 with a statistically worst read current.

The voltage lowering circuit 102 may comprise any of the many commonly used bias generator circuits, which are well known to those skilled in prior art. Such a bias generator circuit would receive the positive voltage supply at node $V_H$ (VDD) and be configured to generate an intermediate voltage ("VDD-delta") for use as an upper supply voltage at node 110 for at least the final inverting driver 108 of circuit 61 for the reference wordline driver 100, where "delta" is a constant independent of "VDD".

Figure 5B:
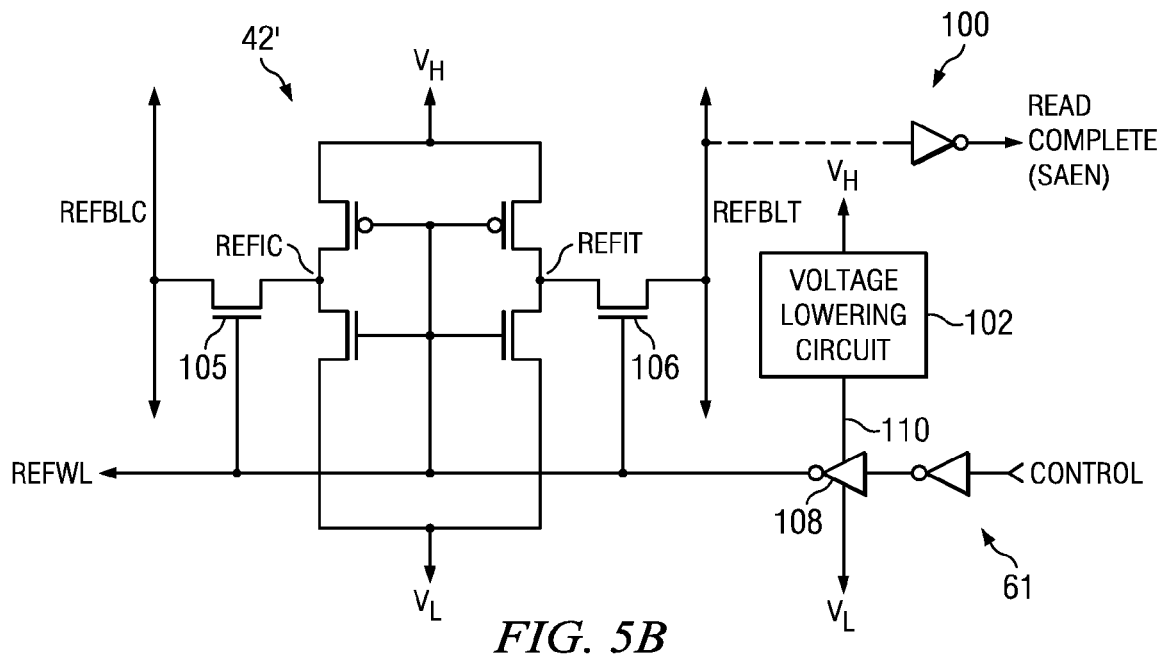

Reference is now made to FIG. 5B which illustrates a circuit diagram of a timer cell 42' and a reference wordline REFWL driver circuit 100 which is included within the reference row decoder 64 circuitry of the memory 30. Here, the timer cell 42' is configured with the passgate transistor 106 and the pulldown transistor 107 at the internal true node REFIT having control (gate) terminals coupled to the reference wordline REFWL. The timer 42' is of the type shown in FIG. 3B, although it will be understood that other timer cell 42' circuit configurations could be used.

Distinguished from prior art driver circuits, the circuit 61 of FIG. 5B, includes a final inverting driver 108 having power supply nodes that are connected to the ground voltage supply at node $V_L$ (GND) and to an intermediate voltage at node 110 receiving a voltage that is lowered below the positive voltage supply at node $V_H$ (VDD). To accomplish this, a voltage lowering circuit 102 is introduced between the higher power supply node (node 110) of the final inverting driver 108 and the positive voltage supply at node $V_H$ (VDD). As a result, the final inverting driver 108 produces an output signal, responsive to an input clock signal on "CONTROL", with a voltage swing from the intermediate voltage ("VDD-delta") to ground voltage (GND). When the lowered voltage ("VDD-delta") is applied to the control (gate) terminals of the pass gate transistor 106 coupled to the internal true node REFIT and the pull down transistor 107 at the internal true node REFIT for timer cell 42, that lowered voltage ("VDD-delta") lowers the gate to source voltage "vgs" of the passgate transistor 106 and pull down transistor 107. The "delta" value introduced by the voltage lowering circuit 102 is selected to be an estimate of an expected shift in threshold voltage "vt" of the passgate and pulldown devices of the memory cell 10 with a statistically worst read current.

The voltage lowering circuit 102 may comprise any of the many commonly used bias generator circuits, which are well known to people skilled in prior art. Such a bias generator circuit would receive the positive voltage supply at node $V_H$ (VDD) and be configured to generate an intermediate voltage ("VDD-delta") for use as an upper supply voltage at node 110 for at least the final inverting driver 108 of circuit 61 for the reference wordline driver 100, where "delta" is a constant independent of "VDD".

Figure 5C:
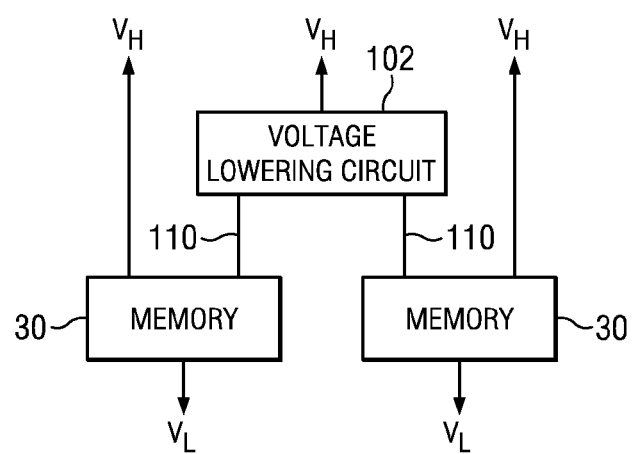
FIG. 5C illustrates use of a voltage lowering circuit to provide a reduced supply voltage to multiple memories.

It should be noted that the voltage lowering circuit 102 in FIGS. 5A and 5B may be shared by multiple final inverting driver 108 circuits within the multiple reference row decoders 64 circuitry (if present) of the memory 30. Thus, the lowered voltage ("VDD-delta") at the intermediate voltage node 110 may be applied as the higher power supply voltage for a plurality of final inverting drivers 108 driving a corresponding plurality of reference wordlines. Still further, the voltage lowering circuit 102 may be shared by multiple memories 30 in an integrated circuit (see, FIG. 5C). In other words, the voltage lowering circuit 102 may be separate from each memory 30, and each memory would include distinct power supply input pin configured to receive the lowered voltage ("VDD-delta") for application to the intermediate voltage node 110 on the power supply node of the final inverting buffer 108 of the reference wordline driver circuit(s) 100 in each memory.

The illustration in FIGS. 5A and 5B of the buffer driver 61 comprising a cascade of two inverting circuits is exemplary only. The buffer driver 61 may have any known driver configuration so long as the higher power supply voltage of the final inverting driver 108 is supplied with the lowered voltage ("VDD-delta") output from the voltage lowering circuit 102 at the intermediate voltage node 110. In this way the reference wordline REFWL in an active state will have a voltage level at the intermediate voltage ("VDD-delta") and the control (gate) terminals of the transistors of the timer cells 42 or 42' which receive this lowered voltage "VDD-delta" (such as passgate transistor 106 only or both passgate transistor 106 and pull down transistor 107) will have a reduced value of gate to source voltage "vgs".

Figure 6A:
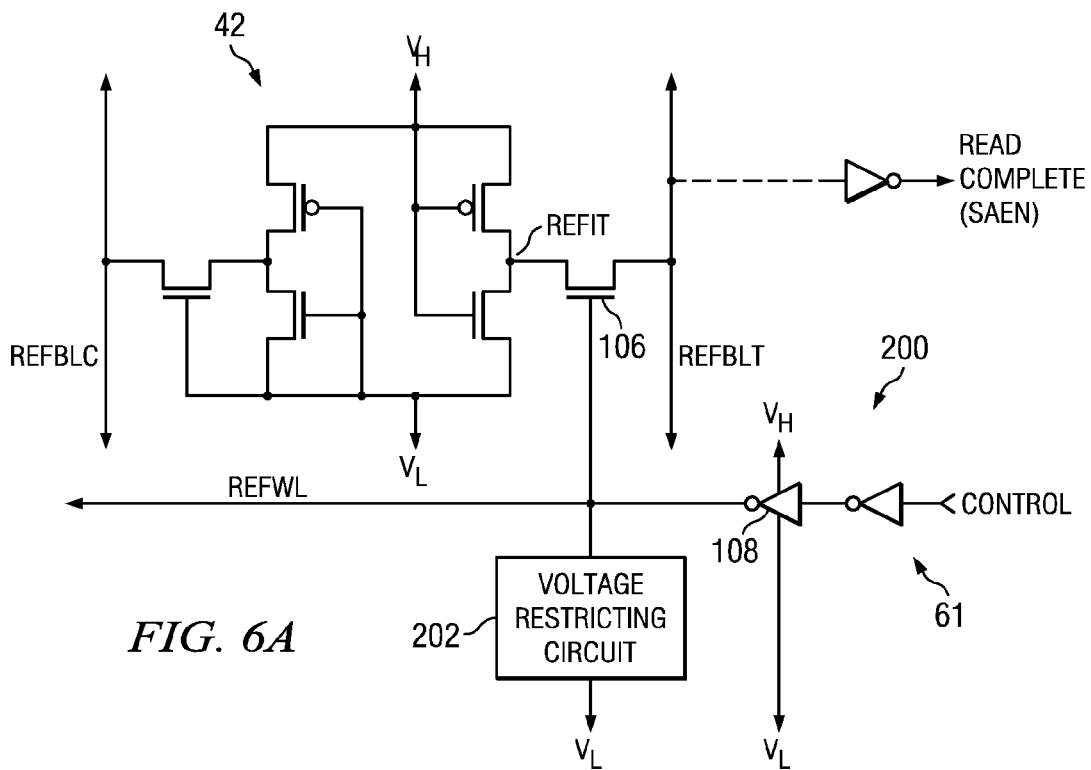
FIGS. 6A and 6B illustrate a circuit diagram of a read timer cell and reference wordline driver circuit.

Reference is now made to FIG. 6A which illustrates a circuit diagram of a timer cell 42 and a reference wordline REFWL driver circuit 200 which is included within the reference row decoder 64 circuitry of the memory 30. Here, the timer cell 42 is configured with only the passgate transistor 106 for the internal true node REFIT having a control (gate) terminal coupled to the reference wordline REFWL. The passgate 105 on the internal complement node REFIC of the cell 42 has a control (gate) terminal coupled to the ground voltage supply at node $V_L$ (GND). The timer 42 is of the type shown in FIG. 3C, although it will be understood that other timer cell 42 circuit configurations could be used.

The reference wordline driver circuit 200 comprises a buffer 61 (perhaps comprising multiple inverter stages, as illustrated) whose power supply nodes are connected to the positive voltage supply at node $V_H$ (VDD) and the ground voltage supply at node $V_L$ (GND). The final inverting driver 108 produces an output signal, responsive to an input internal clock signal on "CONTROL", applied to the reference wordline REFWL of each included (and parallel connected) timer cell 42. This signal does not, however, swing from ground (GND) to full supply voltage (VDD). A voltage restricting circuit 202 is coupled to the reference wordline REFWL between the output of the final inverting driver 108 (REFWL) and the ground voltage node "$V_L$". The voltage restricting circuit 202 functions to restrict (or clamp) the maximum voltage on the reference wordline REFWL to an intermediate voltage value set below the positive voltage supply at node $V_H$ (VDD) by a value "delta". As a result, the final inverting driver 108 produces an output signal, responsive to an input internal clock signal on "CONTROL", with a voltage swing from the lowered voltage (VDD-delta) to ground supply voltage (GND). When the lowered voltage (VDD-delta) is applied to the control gate terminal of the pass gate transistor 106 coupled to the internal true node REFIT of the timer cell 42, that lowered voltage "VDD-delta" lowers the gate to source "vgs" of the passgate transistor 106. The lowering of "delta" from supply voltage "VDD" introduced by the voltage restricting circuit 202 is selected to be an estimate of an expected shift in threshold voltage "vt" of the passgate device of the memory cell 10 with a statistically worst read current.

A specific example of the voltage restricting circuit 202 is provided in FIG. 7A (to be described later). More generally, the voltage restricting circuit 202 may comprise a circuit using suitable open/closed loop analog techniques to provide a restricted or clamped maximum voltage on the reference wordline REFWL (of value "VDD-delta") with a very good control on "delta" to maintain it constant with respect to VDD. Such circuits are well known to those skilled in the art.

Figure 7A:
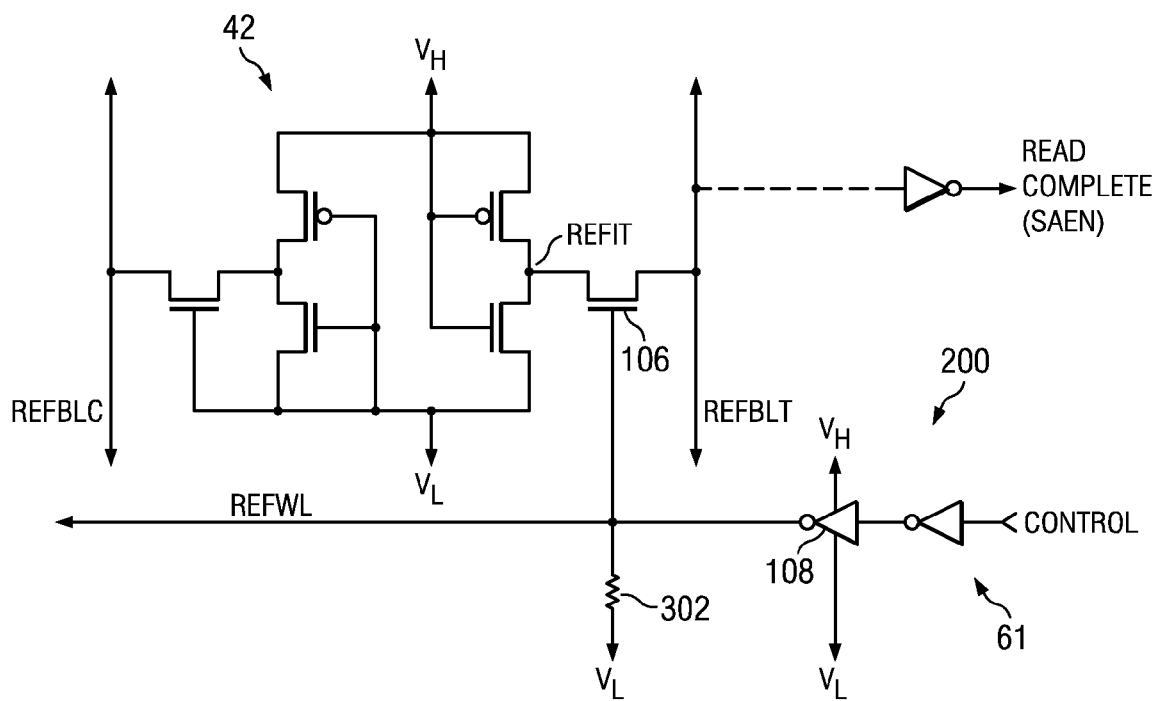
FIGS. 7A and 7B illustrate a circuit diagram of a read timer cell and reference wordline driver circuit.

FIG. 7A illustrates a simple open loop exemplary circuit 202 which uses resistor 302 coupled to the reference wordline REFWL between the output of the final inverting buffer driver 108 and the ground voltage supply at node $V_L$. The resistor 302 functions to generate a voltage drop on the reference wordline REFWL by restricting it from reaching full logic high level "VDD". As a result, the final inverting driver 108 produces an output signal, responsive to an input internal clock signal (on "CONTROL"), with a voltage swing ranging from an intermediate voltage value that is less than the positive voltage supply at node $V_H$ (VDD) to ground voltage supply (GND). When this lowered voltage is applied to the control (gate) terminal of the pass gate transistor 106 coupled to the internal true node REFIT for timer cell 42, that intermediate voltage lowers the gate to source voltage "vgs" of the passgate transistor 106.

The value of the resistor 302 is chosen in such a way based on the strength of the p-channel MOS transistor in the final inverting driver 108 that it counteracts the pull-up just enough to lead to a clamping of the active REFWL voltage level to "VDD-delta", with the value of "delta" decided as near to the expected shift in threshold voltage "vt" of the passgate device of a memory cell 10 with a statistically worst read current. The circuit of the final inverting driver 108 is not modified in any other way—the result of the addition of resistor 302 at its output node REFWL is like a potential division resulting in some DC current during ongoing read operation but that DC current is acceptable in terms of dynamic power loss as it is present only during the read cycle duration.

Figure 6B:
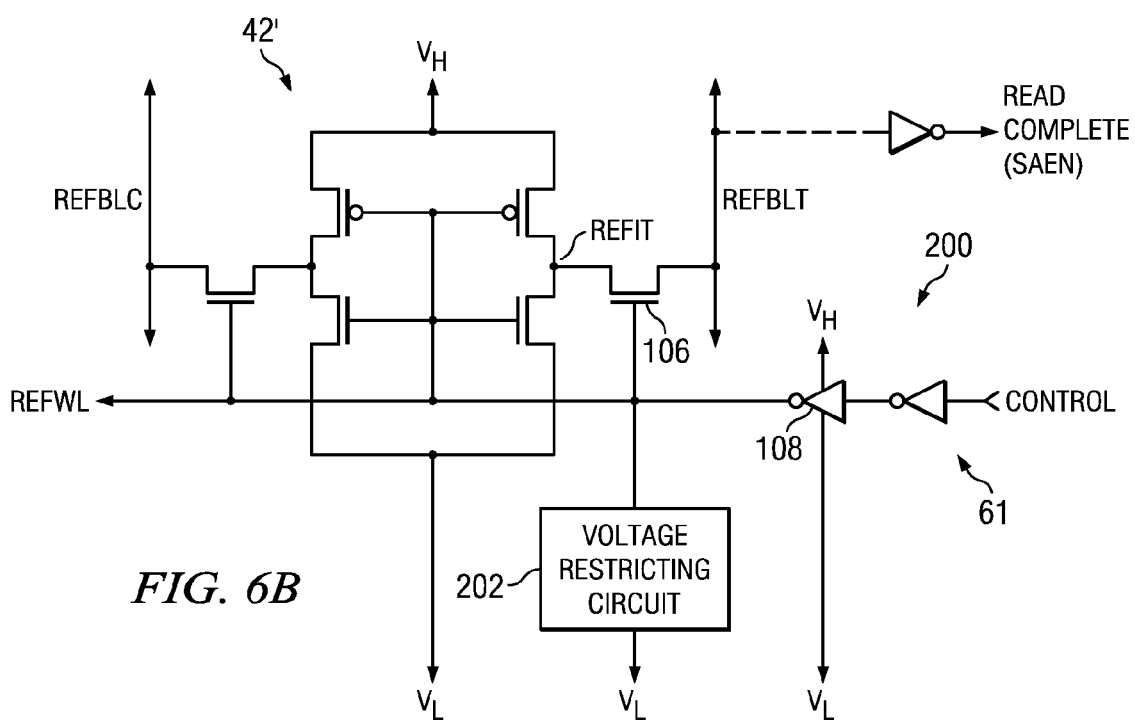

Reference is now made to FIG. 6B which illustrates a circuit diagram of a timer cell 42' and a reference wordline REFWL driver circuit 200 which is included within the reference row decoder 64 circuitry of the memory 30. Here, the timer cell 42' is configured with the passgate transistor 106 and the pulldown transistor 107 at the internal true node REFIT having control (gate) terminals coupled to the reference wordline REFWL. The timer 42' is of the type shown in FIG. 3B, although it will be understood that other timer cell 42' circuit configurations could be used.

The buffer driver 61 (perhaps comprising multiple inverting stages, as illustrated) has power supply nodes connected to the positive voltage supply at node $V_H$ (VDD) and the ground voltage supply at node $V_L$ (GND). The final inverting driver 108 produces an output signal, responsive to an input internal clock signal on "CONTROL", applied to the reference wordline REFWL of each included (and parallel connected) timer cell 42. This signal does not, however, swing from ground (GND) to full supply voltage (VDD). The reference wordline driver circuit 200 includes a voltage restricting circuit 202 coupled to the reference wordline REFWL between the output of the inverting buffer driver 108 (REFWL) and the ground voltage supply at node $V_L$. The voltage restricting circuit 202 functions to restrict (or clamp) the maximum voltage on the reference wordline REFWL to an intermediate voltage value set below the positive voltage supply at node $V_H$ (VDD) by a value "delta". As a result, the final inverting buffer driver 108 of the reference wordline driver circuit 200 produces an output signal, responsive to an input internal clock signal on "CONTROL", with a voltage swing from the lowered voltage "VDD-delta" to ground supply voltage "GND". When the lowered voltage "VDD-delta" is applied to the control (gate) terminals of the pass gate transistor 106 coupled to the internal true node REFIT and the pull down transistor 107 at the internal true node REFIT for timer cell 42, that lowered voltage "VDD-delta" lowers the gate to source "vgs" of the passgate transistor 106 and pull down transistor 107. The lowering value "delta" introduced by the voltage lowering circuit 102 is selected to be approximately (i.e., near to) an expected shift in threshold voltage "vt" for the passgate and pulldown devices of the memory cell 10 with a statistically worst read current.

A specific example of the voltage restricting circuit 202 is provided in FIG. 7B (to be described later). More generally, the voltage restricting circuit 202 may comprise a circuit using suitable open/closed loop analog techniques to provide a restricted or clamped maximum voltage on the reference wordline REFWL (of value "VDD-delta") with a very good control on "delta" to maintain it constant with respect to VDD. Such circuits are well known to those skilled in the art.

Figure 7B:
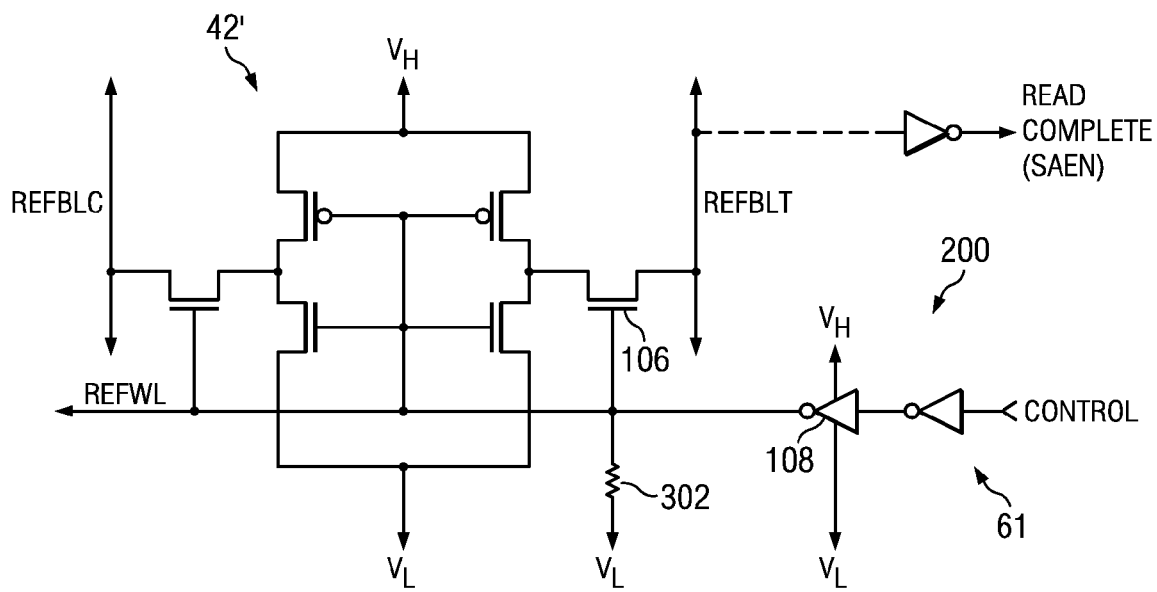

FIG. 7B illustrates a simple open loop exemplary circuit 202 which uses resistor 302 coupled to the reference wordline REFWL between the output of the final inverting driver 108 and the ground voltage supply at node $V_L$. The resistor 302 functions to generate a voltage drop on the reference wordline REFWL by restricting it from reaching full logic high level "VDD". As a result, the final inverting driver 108 produces an output signal, responsive to an input internal clock signal on "CONTROL", with a voltage swing ranging from an intermediate voltage value that is less than the positive voltage supply at node $V_H$ (VDD) to ground voltage supply (GND). When this lowered voltage is applied to the control (gate) terminal of the pass gate transistor 106 coupled to the internal true node REFIT for timer cell 42', that intermediate voltage lowers the gate to source voltage "vgs" of the passgate transistor 106.

The value of the resistor 302 is chosen in such a way based on the strength of the p-channel MOS transistor in the final inverting driver 108 that it counteracts the pull-up just enough to lead to a clamping of the active REFWL voltage level to "VDD-delta", with the value of "delta" decided as near to the expected shift in threshold voltage "vt" of the passgate device of a memory cell 10 with a statistically worst read current. The circuit of the final inverting driver 108 is not modified in any other way—the result of the addition of resistor 302 at its output node REFWL is like a potential division resulting in some DC current during ongoing read operation but that DC current is acceptable in terms of dynamic power loss as it is present only during the read cycle duration.

The illustration in FIGS. 6A, 6B, 7A and 7B of the circuit 200 with buffer 61 comprising a cascade of two inverting drivers is exemplary only. The final inverting driver 108 may have any known driver configuration.

The reference herein to true and complement with respect to nodes or lines is a matter of labeling convenience and is not intended to be limiting or restricting as to structure or operation. Indeed, depending on logic selected for the circuit, such as active high or active low, the true and complement labels will be understood by those skilled in the art to be exchangeable.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A circuit, comprising:
a memory cell array including:
a first section having a plurality of memory cells and a wordline for each row of memory cells in said first section; and
a second section having a plurality of read timer cells arranged in a column, each read timer cell including a reference wordline, a reference true bitline, an internal true node, an access transistor coupled between said internal true node and said reference true bitline and a pull-down transistor coupled between said internal true node and a reference supply node, wherein the reference true bitline is shared by the column of read timer cells;
a reference row decoder circuit coupled to the second section of the memory cell array, said reference row decoder circuit including a reference wordline driver circuit having an output coupled to drive the reference wordline; and
means for lowering a gate to source voltage of timer cell transistors by decreasing a higher voltage level corresponding to logic high that is applied on said reference wordline to actuate said at least one of said access transistor and pull-down transistor during a read operation of memory cells in the first section.

2. The circuit of claim 1, wherein the decreased voltage level is equal to a high supply voltage for the cell array minus a delta voltage value.

3. The circuit of claim 2, wherein the delta voltage value is equal to an estimated shift in threshold voltage of at least one transistor in a memory cell with a statistically worst read current among the plurality of memory cells in the first section of the memory cell array.

4. The circuit of claim 1, wherein the reference wordline driver circuit includes a buffer circuit and the means for lowering comprises a voltage lowering circuit coupled between a high supply voltage node and a higher supply node of said buffer circuit, said voltage lowering circuit operable to apply an intermediate supply voltage to said higher supply node which is equal to a high supply voltage minus a delta voltage value.

5. The circuit of claim 4, wherein the delta voltage value is equal to an estimated shift in threshold voltage of at least one transistor in a memory cell with a statistically worst read current among the plurality of memory cells in the first section of the memory cell array.

6. The circuit of claim 1, wherein the means for lowering comprises a voltage restricting circuit coupled to the reference wordline and configured to limit a logic high voltage applied by the reference wordline driver circuit to said reference wordline to a value which is equal to a high supply voltage minus a delta voltage value.

7. The circuit of claim 6, wherein the delta voltage value is equal to an estimated shift in threshold voltage of at least one transistor in a memory cell with a statistically worst read current among the plurality of memory cells in the first section of the memory cell array.

8. The circuit of claim 1, wherein the means for lowering comprises a pull-down circuit coupled to the reference wordline and configured to control voltage drop on the reference wordline to be same as an equivalent estimated shift in threshold voltage of at least one transistor in a memory cell with a statistically worst read current among the plurality of memory cells in the first section of the memory cell array.

9. The circuit of claim 8, wherein the pull-down circuit comprises a pull-down resistance coupled between the reference wordline and a ground supply node.

10. The circuit of claim 1, further comprising a detection circuit coupled to said reference true bitline and having an output whose logic state changes in response to completion of discharge of the reference true bitline by said timer cells during the read operation.

11. Self-timing circuitry for use in a memory, said memory including a plurality of memory cells, comprising:
a plurality of timer cells arranged in a column;
a reference true bitline coupled to the column of write timer cells;
a reference wordline for each timer cell in the column;
wherein each timer cell includes an internal true node, an access transistor coupled between said internal true node and said reference true bitline and a pull-down transistor coupled between said internal true node and a reference supply node;
a reference wordline driver circuit having an output coupled to said reference wordline;
a detection circuit coupled to said reference true bitline and having an output whose logic state changes in response to completion of discharge of the reference true bitline during a read operation; and
a circuit configured to lower a gate to source voltage of timer cell transistors by decreasing a higher voltage level corresponding to logic high, the decreased voltage for application on said reference wordline to actuate at least one of said access transistor and pull-down transistor during a read operation of memory cells in the memory.

12. The circuitry of claim 11, wherein the decreased voltage level is equal to a high supply voltage for the memory minus a delta voltage value.

13. The circuitry of claim 12, wherein the delta voltage value is equal to an estimated shift in threshold voltage of at least one transistor in a memory cell with a statistically worst read current among the plurality of memory cells in the memory.

14. The circuitry of claim 11, wherein the reference wordline driver circuit includes a buffer circuit and the circuit configured to lower comprises a voltage lowering circuit coupled between a high supply voltage node and a higher supply node of said buffer circuit, said voltage lowering circuit operable to apply an intermediate supply voltage to said higher supply node which is equal to a high supply voltage minus a delta voltage value.

15. The circuitry of claim 11, wherein said circuit configured to lower comprises a voltage restricting circuit coupled to the reference wordline and configured to limit a logic high voltage applied by the reference wordline driver circuit to said reference wordline to a value which is equal to a high supply voltage minus a delta voltage value.

16. The circuitry of claim 11, wherein said circuit configured to lower comprises a pull-down circuit coupled to the reference wordline and configured to control voltage drop on the reference wordline to be same as an equivalent estimated shift in threshold voltage of at least one transistor in a memory cell with a statistically worst read current among the plurality of memory cells in the memory.

17. The circuitry of claim 16, wherein the pull-down circuit comprises a pull down resistance coupled between the reference wordline and a ground supply node.

18. A method, comprising:
reading a logic value from a true side of a timer cell of a self-timed memory, said timer cell including an access transistor coupled between an internal true node and a reference true bitline and a pull-down transistor coupled between said internal true node and a reference supply node;

detecting a completion of a discharge of the reference true bitline by the read timer cell of the self-timed memory;

signaling an enabling of a sense amplifier operation of the self-timed memory in response to detected discharge completion; and lowering a gate to source voltage of a read timer cell transistor by decreasing a higher voltage level corresponding to logic high, the decreased voltage for application on said reference wordline to actuate at least one of said access transistor and pull-down transistor during said logic value read.

19. The method of claim 18, wherein lowering adjusts a timing of discharge of the reference true bitline by the timer cell to better match a timing of discharge of a bitline for a memory cell in the self-timed memory beyond a sense amplifier offset for a sense amplifier coupled to that memory cell.

20. The method of claim 18, wherein lowering adjusts a timing of discharge of a reference bitline for the timer cell resulting in a better match with timing for generation of a voltage differential by a statistically worst read current generating memory cell at sense amplifier inputs sufficient for successful sense amplifier resolution throughout an operating voltage range of the self-timed memory.

21. The method of claim 18, wherein a decreased higher voltage level is equal to a high supply voltage for the memory minus a delta voltage value.

22. The method of claim 21, wherein the delta voltage value is equal to an estimated shift in threshold voltage of at least one transistor in a memory cell with a statistically worst read current among the plurality of memory cells in the memory.

23. The method of claim 18, wherein lowering comprises lowering a higher supply voltage for a reference wordline driver circuit that is operable to perform the step of discharging the reference true bitline.

24. The method of claim 19, wherein lowering comprises restricting a higher voltage applied on the reference wordline to a value less than a high supply voltage in connection with actuating at least one of said access transistor and pull-down transistor in the timer cell.

25. The method of claim 19, wherein lowering comprises resistively pulling down on the reference wordline to a value less than a high supply voltage when actuated to read from the timer cell.

* * * * *